United States Patent
Huang et al.

(10) Patent No.: US 11,855,081 B2
(45) Date of Patent: Dec. 26, 2023

(54) METHOD OF FORMING EPITAXIAL FEATURES

(71) Applicant: Taiwan Semiconductor Manufacturing Company, Ltd., Hsinchu (TW)

(72) Inventors: Ming-Yang Huang, Hsinchu (TW); Yung Feng Chang, Hsinchu (TW); Tung-Heng Hsieh, Hsinchu County (TW); Bao-Ru Young, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 171 days.

(21) Appl. No.: 17/377,705

(22) Filed: Jul. 16, 2021

(65) Prior Publication Data

US 2023/0012743 A1    Jan. 19, 2023

(51) Int. Cl.
*H01L 27/088* (2006.01)
*H01L 29/66* (2006.01)
*H01L 29/78* (2006.01)
*H01L 21/8234* (2006.01)

(52) U.S. Cl.
CPC .. *H01L 27/0886* (2013.01); *H01L 21/823418* (2013.01); *H01L 21/823431* (2013.01); *H01L 21/823468* (2013.01); *H01L 29/6656* (2013.01); *H01L 29/6681* (2013.01); *H01L 29/7851* (2013.01)

(58) Field of Classification Search
CPC ......... H01L 27/0886; H01L 21/823418; H01L 21/823431; H01L 21/823468; H01L 29/6656; H01L 29/6681; H01L 29/7851
See application file for complete search history.

(56) References Cited

U.S. PATENT DOCUMENTS

| | | | |
|---|---|---|---|
| 9,818,872 | B2 | 11/2017 | Ching et al. |
| 9,887,269 | B2 | 2/2018 | Ching et al. |
| 9,899,398 | B1 | 2/2018 | Colinge et al. |
| 10,032,627 | B2 | 7/2018 | Lee et al. |
| 10,109,721 | B2 | 10/2018 | Lin et al. |
| 10,157,799 | B2 | 12/2018 | Ching et al. |
| 10,199,502 | B2 | 2/2019 | Huang et al. |

(Continued)

*Primary Examiner* — Christine A Enad
(74) *Attorney, Agent, or Firm* — HAYNES AND BOONE, LLP

(57) ABSTRACT

Semiconductor structures and methods are provided. A method according to the present disclosure includes providing a workpiece that includes a plurality of active regions including channel regions and source/drain regions, and a plurality of dummy gate stacks intersecting the plurality of active regions at the channel regions, the plurality of dummy gate stacks including a device portion and a terminal end portion. The method further includes depositing a gate spacer layer over the workpiece, anisotropically etching the workpiece to recess the source/drain regions and to form a gate spacer from the gate spacer layer, forming a patterned photoresist layer over the workpiece to expose the device portion and the recessed source/drain regions while the terminal end portion is covered, and after the forming of the patterned photoresist layer, epitaxially forming source/drain features over the recessed source/drain regions.

20 Claims, 20 Drawing Sheets

(56) References Cited

U.S. PATENT DOCUMENTS

| | | |
|---|---|---|
| 10,290,546 B2 | 5/2019 | Chiang et al. |
| 10,475,902 B2 | 11/2019 | Lee et al. |
| 2018/0175036 A1 | 6/2018 | Ching et al. |
| 2020/0006478 A1* | 1/2020 | Hsu .................... H01L 29/42392 |
| 2020/0381545 A1* | 12/2020 | Chiang ............... H01L 29/0673 |

* cited by examiner

METHOD OF FORMING EPITAXIAL FEATURES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

In some existing processes to form multi-gate devices, a gate spacer is deposited over a semiconductor dummy gate stack before source/drain recesses are formed. In some instances when the gate spacer is compromised and a portion of the semiconductor dummy gate stack is exposed, a subsequent epitaxial deposition process may deposit mushroom-like structures on the exposed portion of the semiconductor dummy gate stack. After the semiconductor dummy gate stack is replaced with a metal gate structure, the mushroom-like structures may become a metal feature that can cause shorts. While existing processes to form a multi-gate device are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
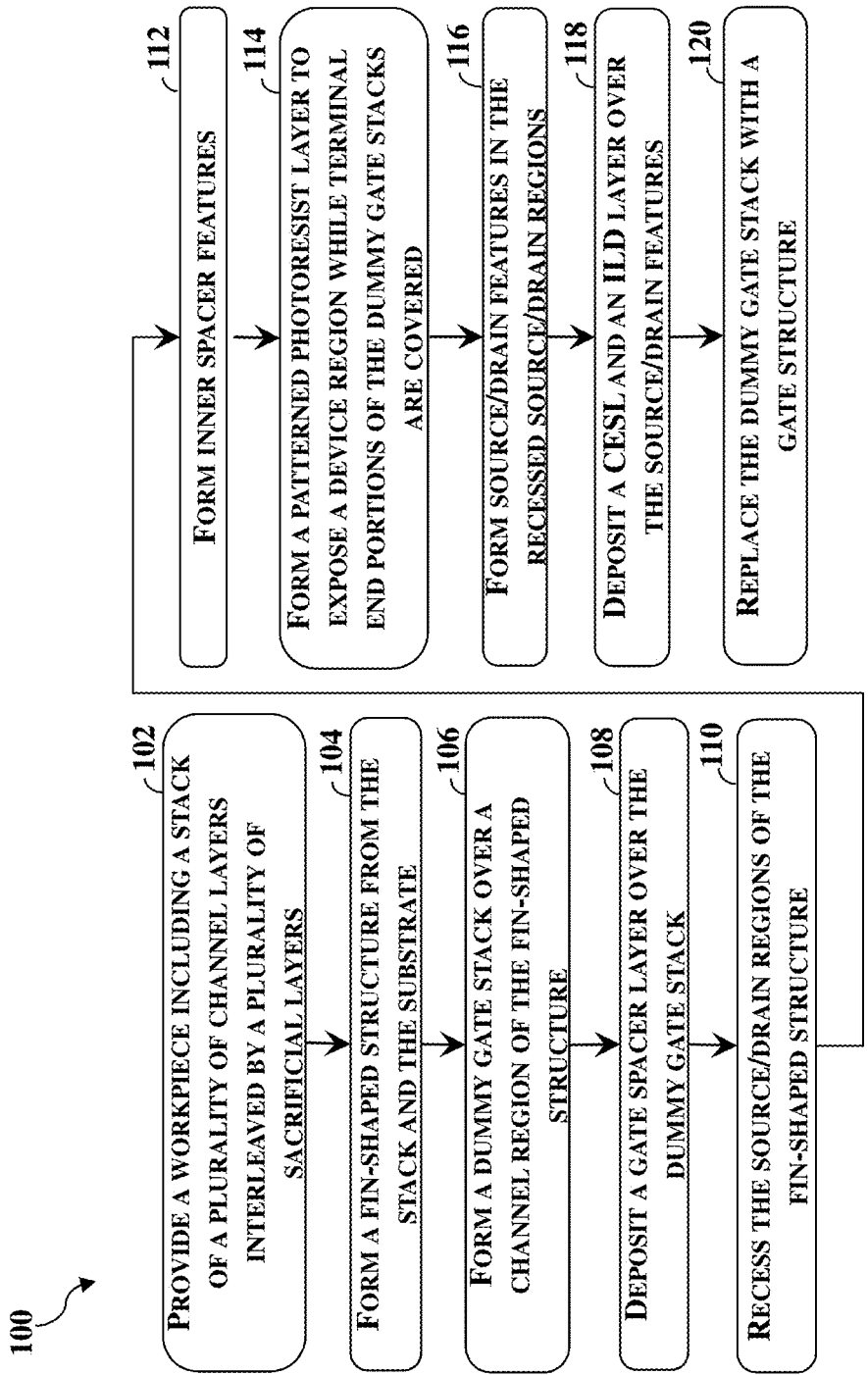
FIG. 1 illustrates a flowchart of a method for forming a semiconductor structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In a gate-last process or a replacement gate process, dummy gate stacks are first formed over channel regions of active regions. At least one gate spacer is then deposited over the dummy gate stacks before source/drain regions of the active regions are recessed to form source/drain recesses. In some examples, the terminal end portions of each of the dummy gate stacks extends well over the nearest active region. In other words, the terminal end portions of a dummy gate stack may overshoot in order to ensure gate engagement. It is observed that the at least one gate spacer disposed on end surfaces of the dummy gate stacks may be damaged during the source/drain recess process, thereby exposing a portion of the dummy gate stacks. Because the dummy gate stacks are formed of polysilicon, a semiconductor material, the subsequent epitaxial process to form source/drain features may result in epitaxial growth on the exposed portion of the dummy gate stacks. Such epitaxial growth may form mushroom-like structures on the end surfaces of the dummy gate stacks. When the dummy gate stacks are later replaced with a gate structures, the mushroom-like structures may be replaced as well, leading to shorts and other defects.

The present disclosure provides embodiments of methods for forming multi-gate devices. In an example method, after active regions extending along the X direction and dummy gate stacks extending along the Y direction are formed on a workpiece, at least one gate spacer is formed over the dummy gate stacks. Each of the dummy gate stacks includes terminal end portions that overshoot outer-most active regions. After the formation of the at least one gate spacer, the workpiece is subject to a source/drain recess process without use of an etch mask to form source/drain recesses. After the source/drain recess process, sidewalls of the active regions are exposed in the source/drain recesses. Thereafter, one or more patterned photoresist layers may be formed to expose source/drain regions while the terminal end portions are covered by the one or more patterned photoresist layers. The one or more patterned photoresist layers prevent semiconductor material from being deposited on terminal end portions of the dummy gate stacks during the source/drain feature formation process. Because the one or more gate spacers may be consumed during the source/drain feature formation process, the one or more gate spacers at the terminal end portions may have a greater thickness.

The various aspects of the present disclosure will now be described in more detail with reference to the figures. In that regard, FIG. 1 is a flowchart illustrating a method 100 of forming a semiconductor structure from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-20, which are fragmentary cross-sectional views or fragmentary top views of workpiece 200 at different stages of fabrication of the method 100 in FIG. 1. Because the workpiece 200 will be fabricated into a semiconductor structure or a semiconductor device, the workpiece 200 may be referred to herein as a semiconductor device 200 or a semiconductor structure 200 as the context requires. For avoidance of doubts, the X, Y and Z directions in FIGS. 2-20 are perpendicular to one another. Throughout the present disclosure, like reference numerals denote like features, unless otherwise excepted.

Figure 2:
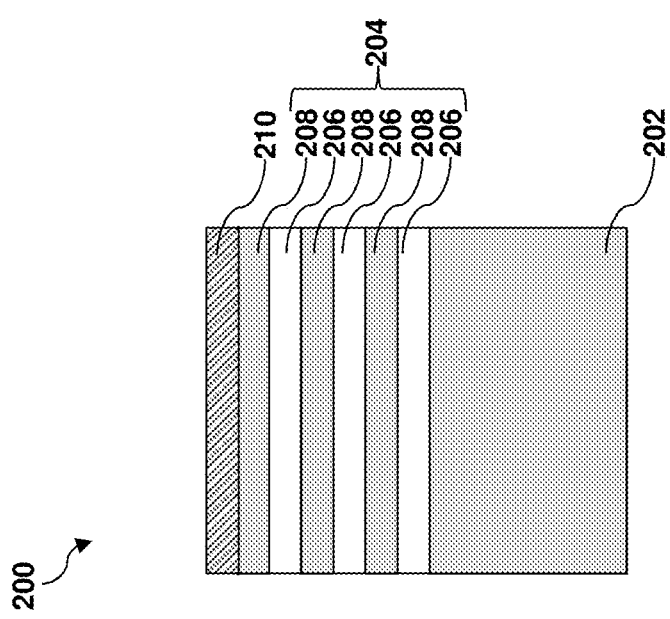
FIGS. 2-20 illustrate fragmentary cross-sectional views or top views of a workpiece during various fabrication processes of the method of FIG. 1, according to one or more aspects of the present disclosure.

Referring to FIGS. 1 and 2, method 100 includes a block 102 where a stack 204 of alternating semiconductor layers is formed over the workpiece 200. As shown in FIG. 2, the workpiece 200 includes a substrate 202. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenide (As). In embodiments where the semiconductor device is n-type, a p-type doping profile (i.e., a p-type well or p-well) may be formed on the substrate 202. In some implementations, the p-type dopant for forming the p-type well may include boron (B) or boron difluoride ($BF_2$). The suitable doping techniques may include ion implantation of dopants and/or diffusion processes. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition are interleaved with channel layers 208 of a second semiconductor composition. That is, the sacrificial layers 206 and the channel layers 208 are alternatingly deposited one over another to form the stack 204. The first and second semiconductor composition may be different. In some embodiments, the sacrificial layers 206 include silicon germanium (SiGe) and the channel layers 208 include silicon (Si). It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

The layers in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 $cm^{-3}$ to about $1\times10^{17}$ $cm^{-3}$). In other words, no intentional doping is performed during the epitaxial growth processes for the stack 204. The workpiece 200 in FIG. 2 also includes a hard mask layer 210. The hard mask layer 210 may be a single layer or a multi-layer. For example, the hard mask layer 210 may include a pad oxide layer and a pad nitride layer over the pad oxide layer. As will be described below, the hard mask layer 210 may be used to pattern the stack 204.

Figure 3:
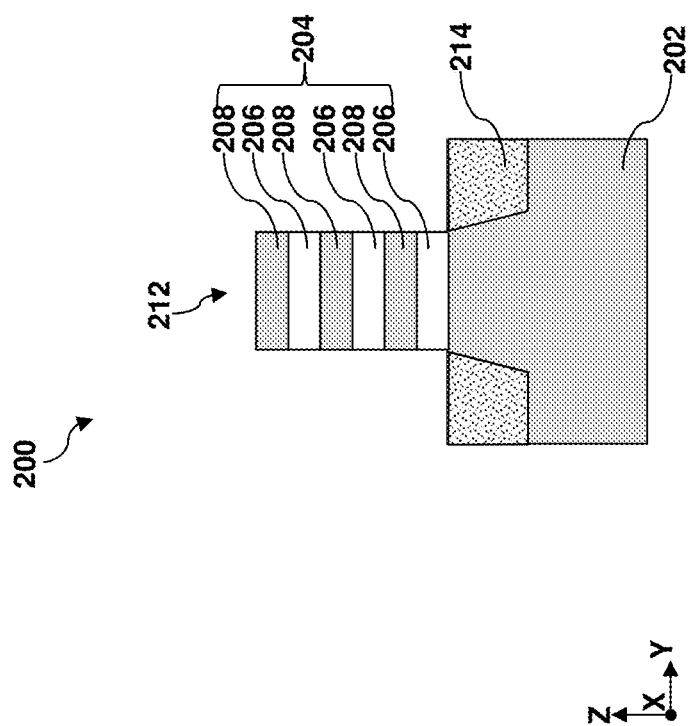
Figure 4:
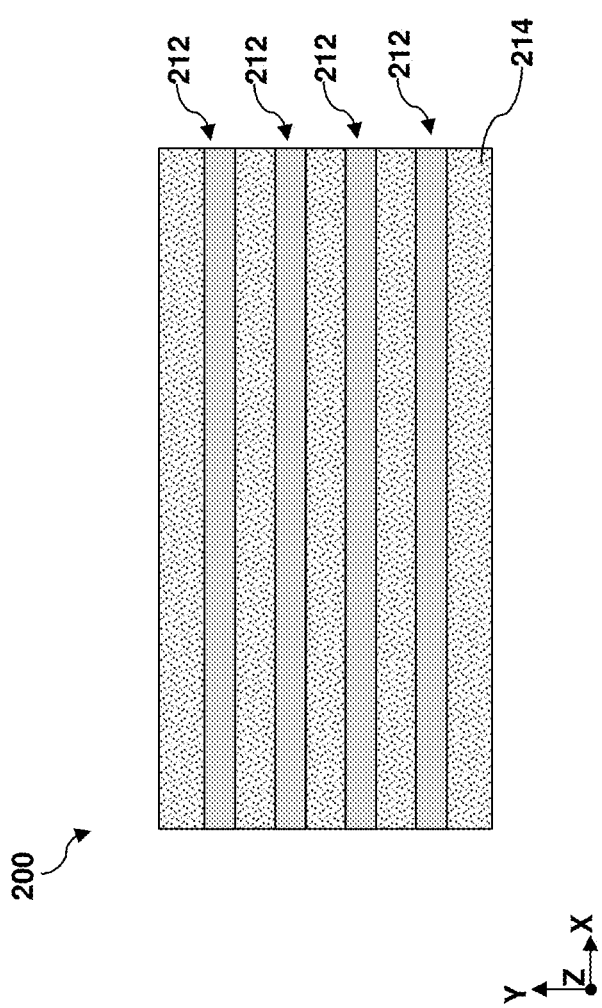

Referring to FIGS. 1, 3 and 4, method 100 includes a block 104 where a fin-shaped structure 212 is formed from the stack 204 and the substrate 202. As described above, a hard mask layer 210 is formed over the stack 204 for patterning purposes. The fin-shaped structure 212 may be patterned from the stack 204 and a portion of the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212, along with the sacrificial layers 206 and the channel layers 208 therein, extends vertically along the Z direction and lengthwise along the X direction.

Reference is still made to FIG. 3. After the fin-shaped structure 212, an isolation feature 214 is formed adjacent the fin-shaped structure 212. In some embodiments, the isolation feature 214 may be formed in the trenches to isolate the fin-shaped structures 212 from a neighboring active region. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214. The fin-shaped structure 212 rises above the STI feature 214 after the recessing. A workpiece 200 may include multiple fin-shaped structures 212 isolated by isolation features 214, as shown in the fragmentary top view in FIG. 4. Each of the fin-shaped structures 212 extends along the X direction.

Figure 5:
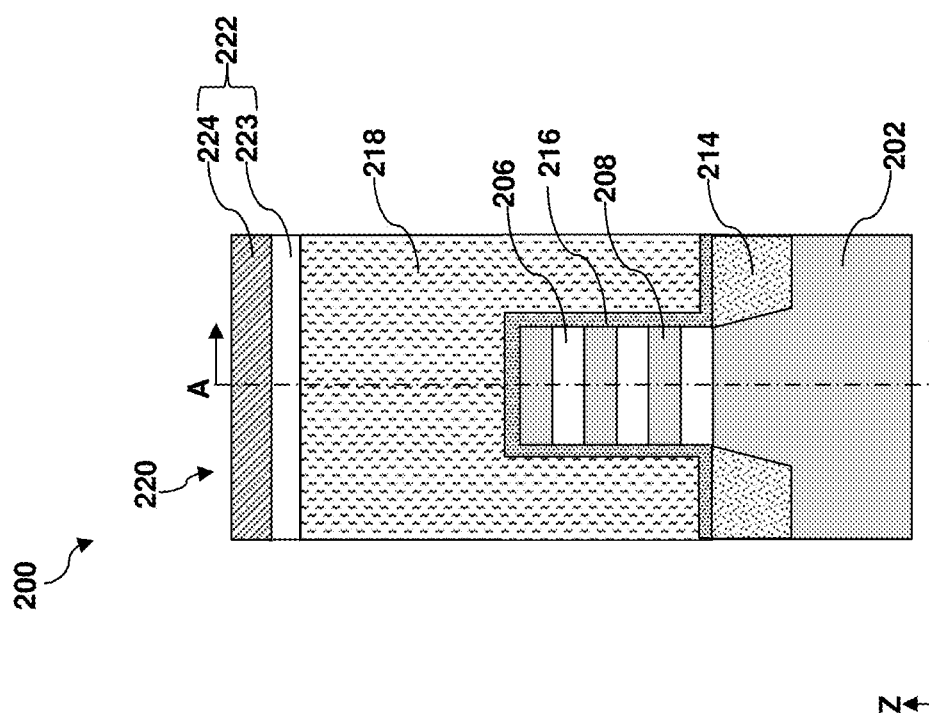
Figure 6:
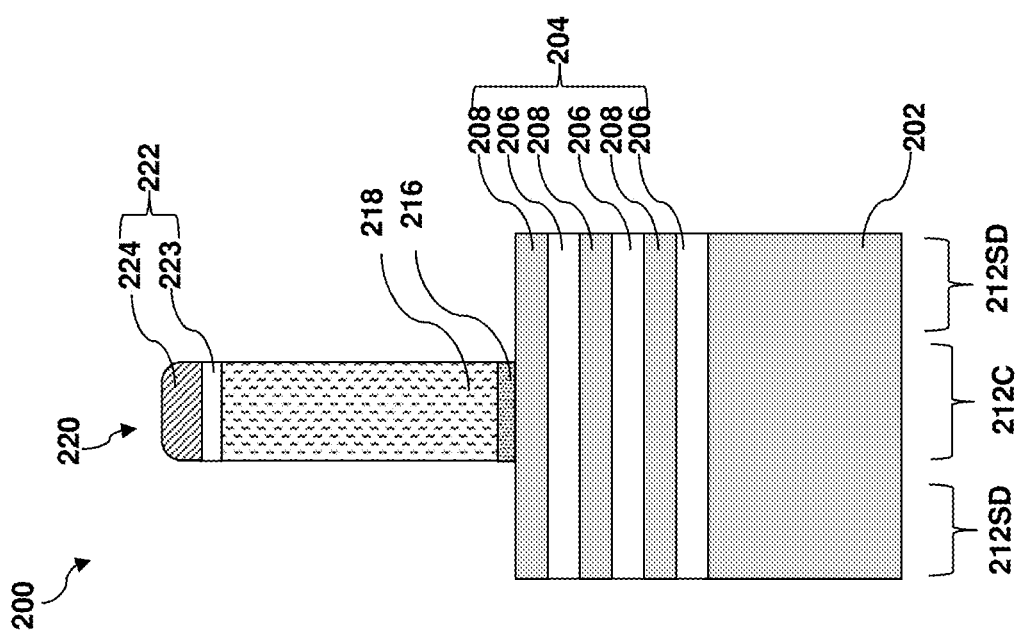

Referring to FIGS. 1, 5, 6, and 7, method 100 includes a block 106 where a dummy gate stack 220 is formed over a channel region 212C of the fin-shaped structure 212. In some embodiments, a gate replacement process (or gate-last process) is adopted where the dummy gate stack 220 serves as a placeholder to undergo various processes and is to be removed and replaced by the functional gate structure. Other processes and configuration are possible. In some embodiments illustrated in FIG. 5, the dummy gate stack 220 that extends along the Y direction is formed over the fin-shaped structure 212. As shown in FIG. 6, each of the fin-shaped structures 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, the channel region 212C is disposed between two source/drain regions 212SD along the X direction.

The formation of the dummy gate stack 220 may include deposition of layers in the dummy gate stack 220 and patterning of these layers. Referring back to FIG. 5, a dummy dielectric layer 216, a dummy electrode layer 218, and a gate-top hard mask layer 222 may be blanketly deposited over the workpiece 200. In some embodiments, the dummy dielectric layer 216 may be formed on the fin-shaped structure 212 using a chemical vapor deposition (CVD) process, an ALD process, an oxygen plasma oxidation process, or other suitable processes. In some instances, the dummy dielectric layer 216 may include silicon oxide. Thereafter, the dummy electrode layer 218 may be deposited over the dummy dielectric layer 216 using a CVD process, an ALD process, or other suitable processes. In some instances, the dummy electrode layer 218 may include polysilicon. For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 6, no dummy gate stack 220 is disposed over the source/drain region 212SD of the fin-shaped structure 212.

Figure 7:
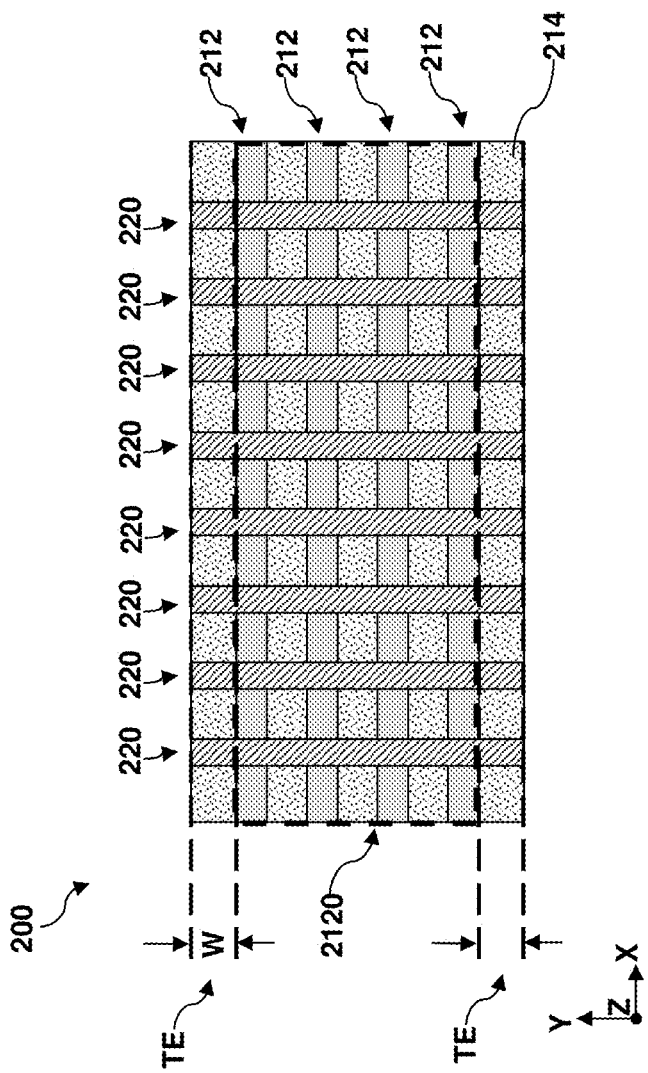

In a top view shown in FIG. 7, the workpiece 200 includes a plurality of fin-shaped structures 212 extending along the X direction and a plurality of dummy gate stacks 220 extending along the Y direction. In terms of the design of the layout, the fin-shaped structures 212 and the dummy gate stacks 220 intersects at channel regions 212C of the fin-shaped structures 212. As shown in FIG. 7, to ensure gate engagement with the fin-shaped structures 212, each of the dummy gate stacks 220 overshoots a device region 212D by a terminal end portion (TE) along the Y direction. The terminal end portion (TE) has a width W along the Y direction. The width W is between about 15 nm and about 35 nm depending on the resolution of the photolithography techniques. This range is not trivial. When the width W is smaller than 15 nm, the terminal end portion (TE) may not be wide enough to accommodate the process variations. When the width W is greater than 35 nm, the terminal end portion (TE) may take up too much real estate and unduly enlarge the cell height. The rectangular device region 212D includes more than one fin-shaped structures 212. Each of the terminal end portion (TE) is defined between an outer-power fin-shaped structure 212 in the device region 212D and a tip of a dummy gate stack 220. Each of the terminal end portions (TEs) includes an end surface. When the end surface is exposed during an epitaxy process to form source/drain features, epitaxial growth may take place at the exposed end surface to form mushroom-shaped structures.

Figure 8:
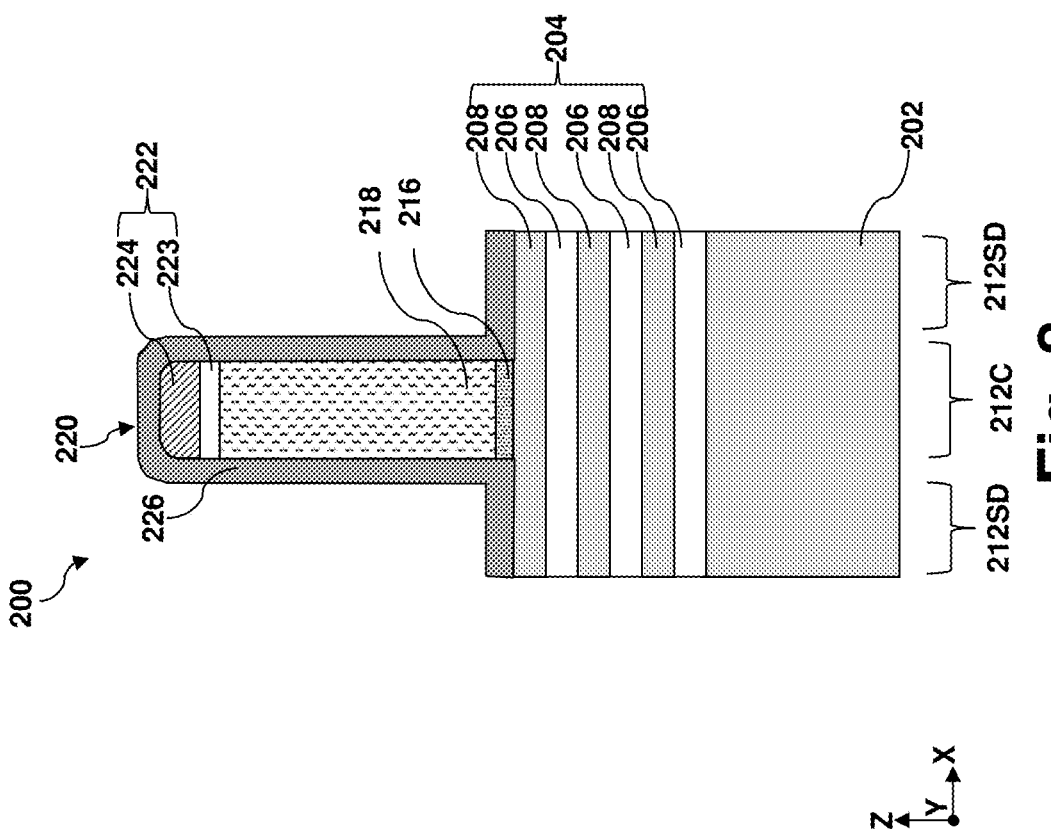
Figure 9:
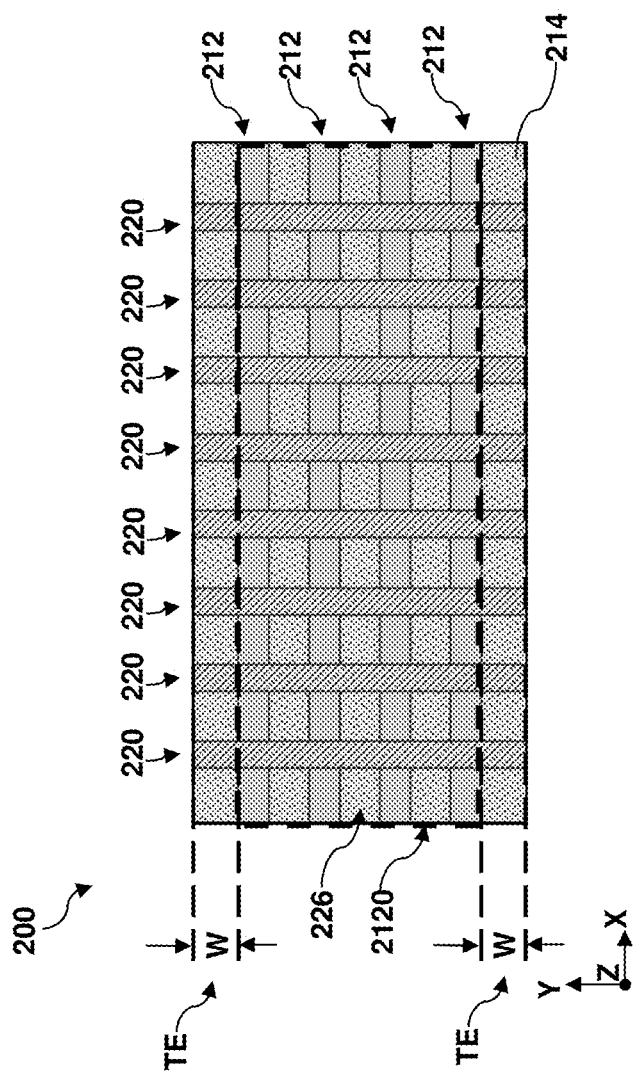

Referring to FIGS. 1, 8 and 9, method 100 includes a block 108 where a gate spacer layer 226 is deposited over the dummy gate stack 220. In some embodiments represented in FIGS. 8 and 9, the gate spacer layer 226 is deposited conformally over the workpiece 200, including over top surfaces and sidewalls of the dummy gate stack 220 as well as over the source/drain regions. The term "conformally" may be used herein for ease of description of a layer having substantially uniform thickness over various regions.

The gate spacer layer 226 may be a single layer or a multi-layer. The at least one layer in the gate spacer layer 226 may include silicon carbonitride, silicon oxycarbide, silicon oxycarbonitride, or silicon nitride. The gate spacer layer 226 may be deposited over the workpiece 200 using processes such as, a CVD process, a subatmospheric CVD (SACVD) process, an ALD process, or other suitable process.

Figure 10:
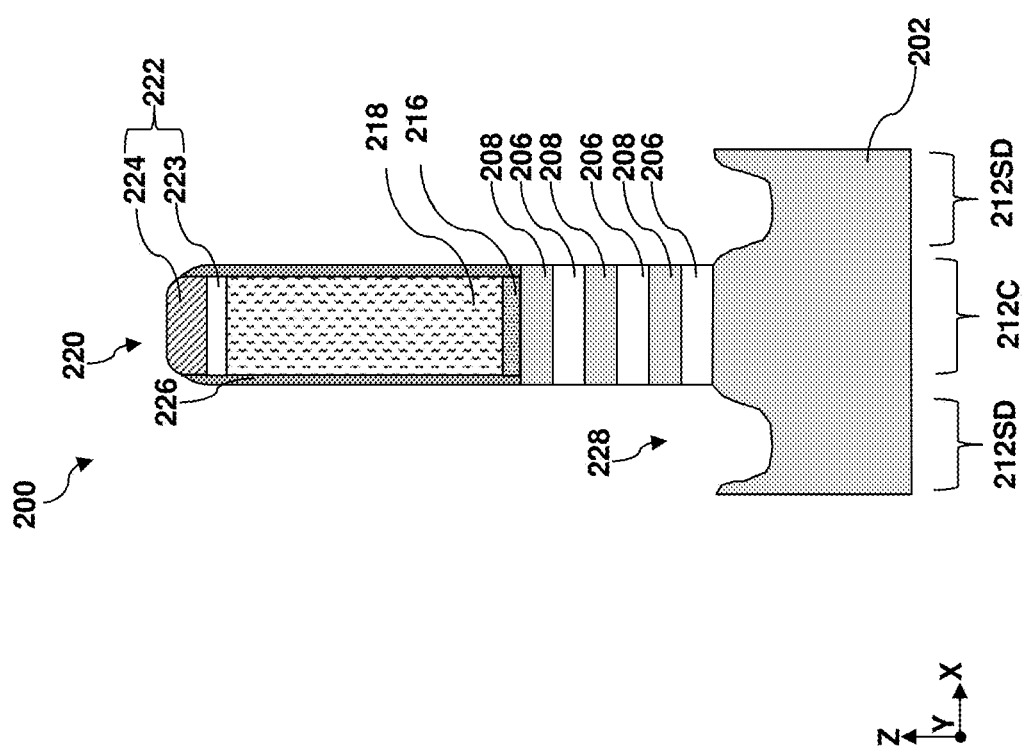
Figure 11:
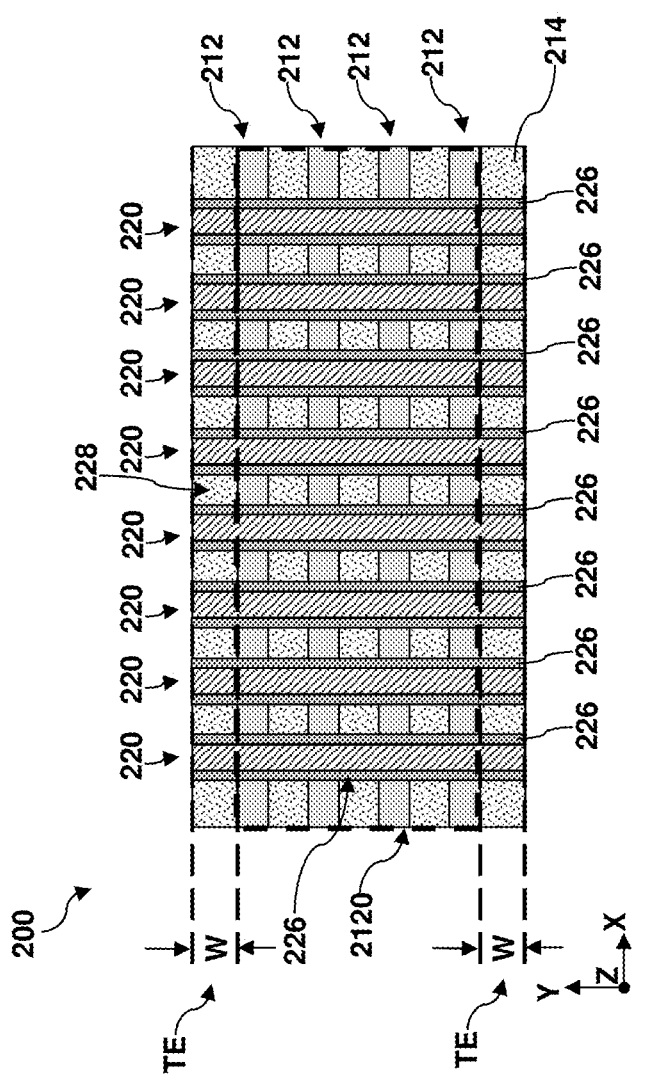

Referring to FIGS. 1, 10 and 11, method 100 includes a block 110 where a source/drain region 212SD of the fin-shaped structure 212 is recessed to form a source/drain trench 228. In some embodiments, the source/drain regions 212SD that are not covered by the dummy gate stack 220 are etched by a dry etch or a suitable etching process to form the source/drain trenches 228. As shown in FIG. 10, operations at block 110 leave behind the gate spacer layer 226 extending along sidewalls of the dummy gate stacks 220. The gate spacer layer 226 on top-facing surfaces are substantially removed at block 110. The dry etch process at block 110 may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 10, sidewalls of the sacrificial layers 206 and the channel layers 208 in the channel regions 212C are exposed in the source/drain trenches 228 over the source/drain regions 212SD. In some implementations, the source/drain trenches 228 extend below the stack 204 into the substrate 202. FIG. 11 illustrates a fragmentary top view of the workpiece 200. Because the recessing at block 110 does not include use of an etch mask, the thickness of the gate spacer layer 226 (measured along the X direction) along sidewalls of the dummy gate stacks 220 are uniform throughout the entire lengths of the dummy gate stacks along the Y direction. That is, the gate spacer layer 226 in the device region 212O has the same thickness as the gate spacer layer 226 in the terminal end portions (TEs).

Figure 12:
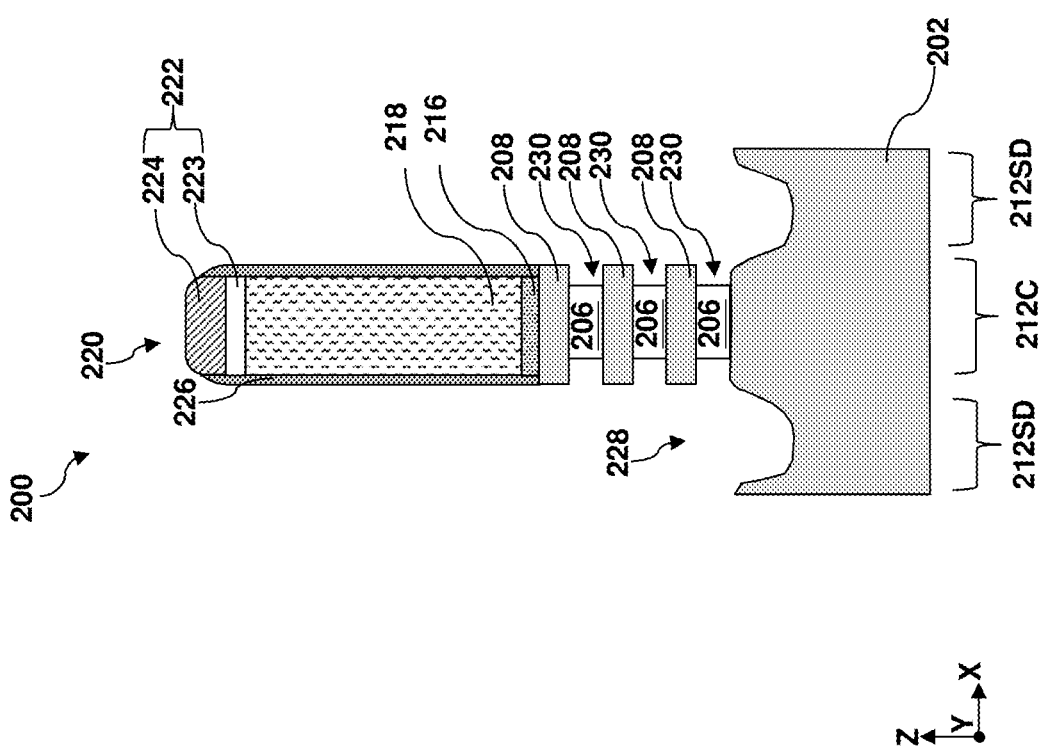
Figure 13:
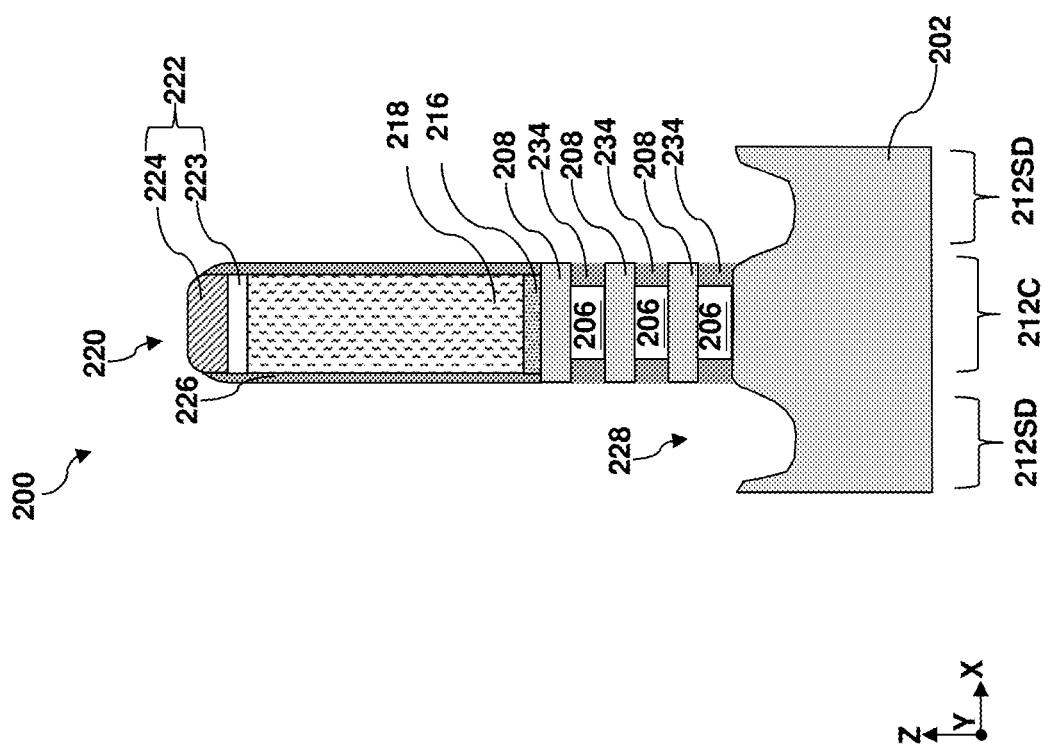

Referring to FIGS. 1, 12 and 13, method 100 includes a block 112 where inner spacer features 234 are formed. While not shown explicitly, operation at block 112 may include selective and partial removal of the sacrificial layers 206 to form inner spacer recesses 230 (shown in FIG. 12), deposition of inner spacer material over the workpiece 200, and etch back the inner spacer material to form inner spacer features 234 in the inner spacer recesses 230 (shown in FIG. 13). The sacrificial layers 206 exposed in the source/drain trenches 228 (shown in FIG. 10) are selectively and partially recessed to form inner spacer recesses 230 while the gate spacer layer 226, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. The selective and partial recess of the sacrificial layers 206 may include a SiGe oxidation process followed by a SiGe oxide removal. In that embodiments, the SiGe oxidation process may include use of ozone. In some other embodiments, the selective dry etching process may include use of one or more fluorine-based etchants, such as fluorine gas or hydrofluorocarbons. The selective wet etching process may include an APM etch (e.g., ammonia hydroxide-hydrogen peroxide-water mixture).

After the inner spacer recesses 230 are formed, the inner spacer material is deposited over the workpiece 200, including over the inner spacer recesses 230. The inner spacer material may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material may be a single layer or a multilayer. In some implementations, the inner spacer material may be deposited using CVD, PECVD, SACVD, ALD or other suitable methods. The inner spacer material is deposited into the inner spacer recesses 230 as well as over the sidewalls of the channel layers 208 exposed in the source/drain trenches 228. Referring to FIG. 13, the deposited inner spacer material is then etched back to remove the inner spacer material on the sidewalls of the channel layers 208 to form the inner spacer features 234 in the inner spacer recesses 230. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 13, each of the inner spacer features 234 is in direct contact with the recessed sacrificial layers 206 and is disposed between two neighboring channel layers 208.

While not explicitly shown, after the formation of the inner spacer features 234, the workpiece 200 may undergo a cleaning process to prepare the workpiece 200 for the epitaxial growth process. The cleaning process may include a dry clean, a wet clean, or a combination thereof. In some examples, the wet clean may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), or hydrofluoric acid for oxide removal. The dry clean process may include helium (He) and hydrogen ($H_2$) treatment. The cleaning process may remove surface oxide and debris in order to ensure a clean semiconductor surface, which facilitates growth of high quality epitaxial layers at block 116.

Referring to FIGS. 1, 14, 15, and 16, method 100 includes a block 114 where a patterned photoresist layer is formed to expose at least a portion of the device region 212O while terminal end portions (TEs) of the dummy gate stacks 220 are covered. Depending on the design need, the multi-gate transistors formed in the device region 212O may be of the same or different conductivity types. In some embodiments represented in FIG. 14, all multi-gate transistors in the device region 212O are of the same conductivity type such that only one first patterned photoresist layer 236 is formed at block 114. In some other embodiments represented in FIGS. 15 and 16, the device region 212O may include an n-type device region and a p-type device region and a second patterned photoresist layer 2362 and a third patterned photoresist layer 2364 are formed at block 114. In terms of GDS II files for the design of the layout, the opening in the patterned photoresist layer at block 114 is perfectly aligned with end portions of the dummy gate stacks 220. However, in order to achieve the objective of covering the end portions of the dummy gate stacks 220 in the face of process variation, the terminal end portions (TE) of the present disclosure are implemented.

Figure 14:
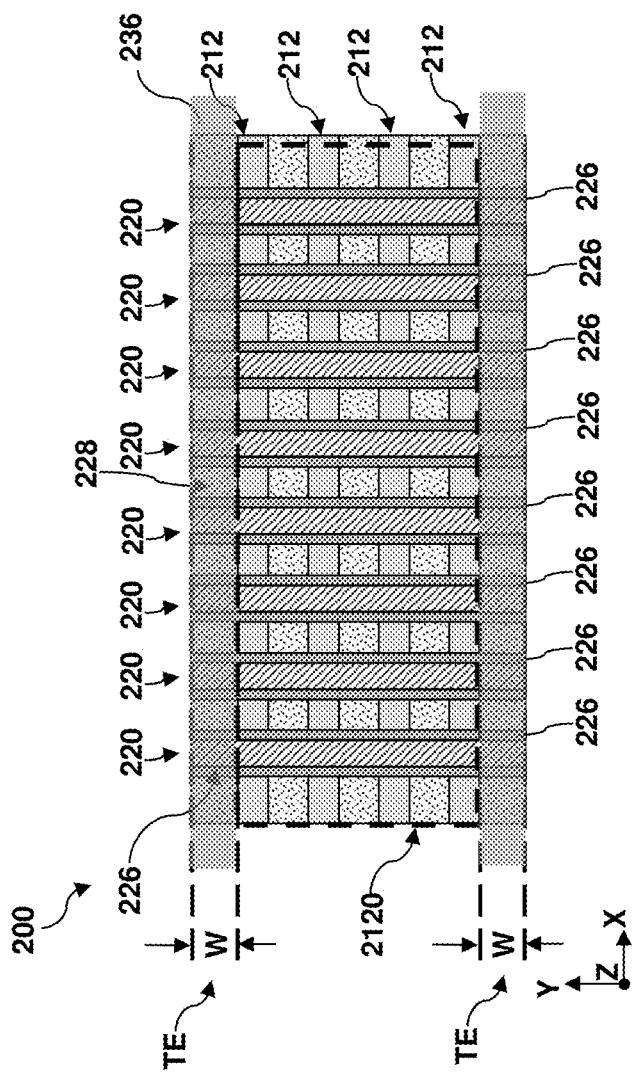
Figure 15:
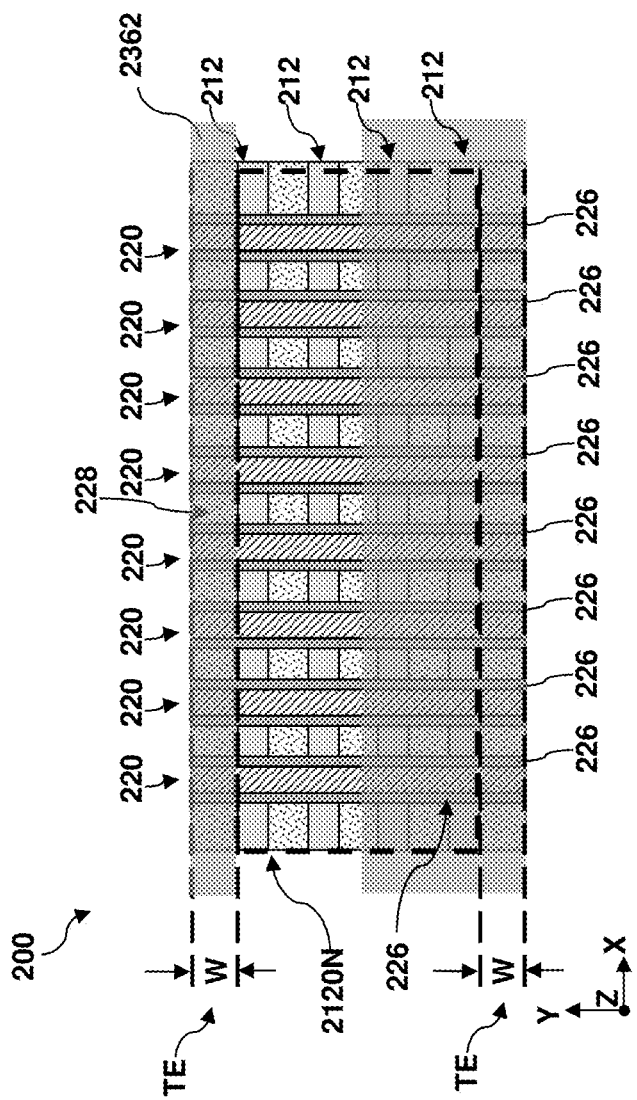
Figure 16:
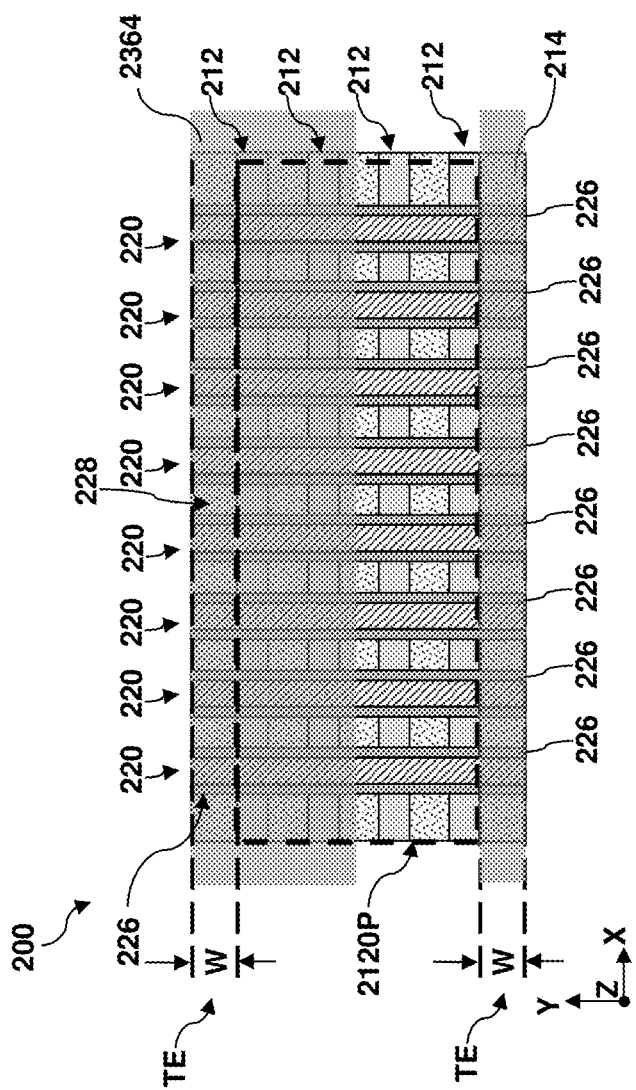

Referring first to FIG. 14, the first patterned photoresist layer 236 covers the terminal end portions (TEs) of the dummy gate stacks 220 that extend beyond the outer-most fin-shaped structures 212 (i.e., the topmost fin-shaped structure 212 and the bottom-most fin-shaped structure 212 in FIG. 14) and exposes the entire device region 2120. Referring to FIG. 15, the second patterned photoresist layer 2362 exposes an n-type device region 2120N while the rest of the device region 2120 and the terminal end portions (TEs) are covered. In subsequent processes, n-type source/drain features may be formed in the exposed n-type device region 2120N while the terminal end portions (TEs) are protected by the first patterned photoresist layer 236. Referring to FIG. 16, the third patterned photoresist layer 2364 exposes a p-type device region 2120P while the rest of the device region 2120 and the terminal end portions (TEs) are covered. In subsequent processes, p-type source/drain features may be formed in the exposed p-type device region 2120P while the terminal end portions (TEs) are protected by the first patterned photoresist layer 236. According to the present disclosure, when the device region 2120 includes two device regions, either one of the second patterned photoresist layer 2362 or the third patterned photoresist layer 2364 may be formed first. After the n-type source/drain features or the p-type source/drain features are formed, the first formed patterned photoresist layer is removed and the other patterned photoresist layer (the second patterned photoresist layer 2362 or the third patterned photoresist layer 2364) is formed. Thereafter, source/drain features of a different conductivity type are formed.

Figure 17:
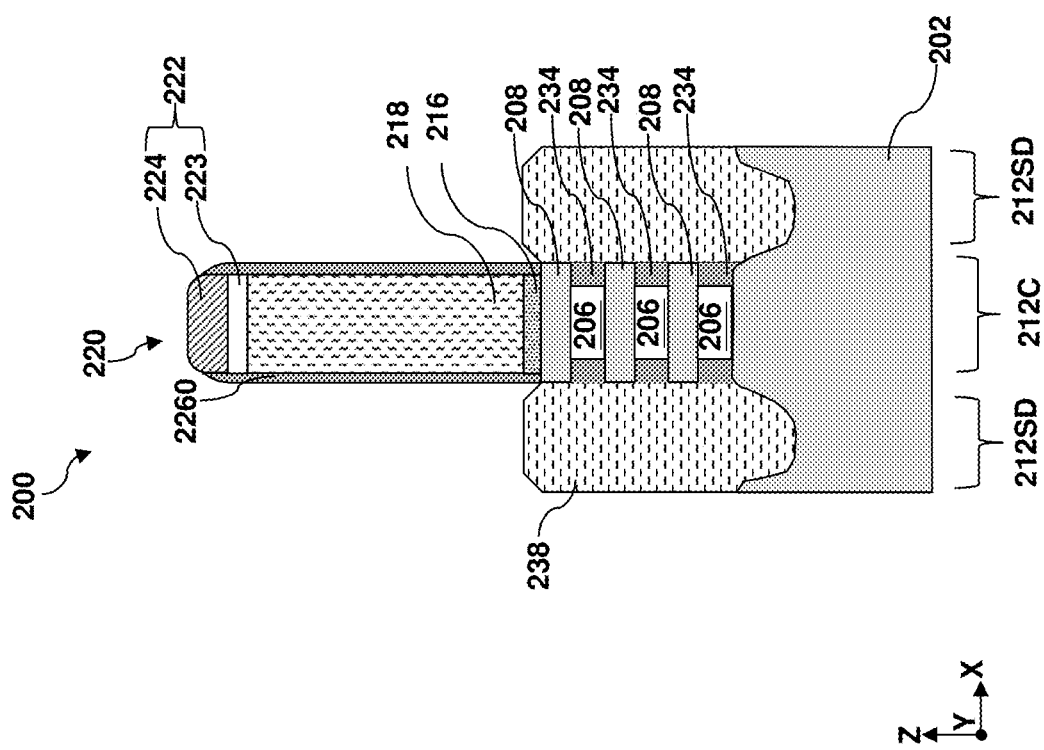
Figure 18:
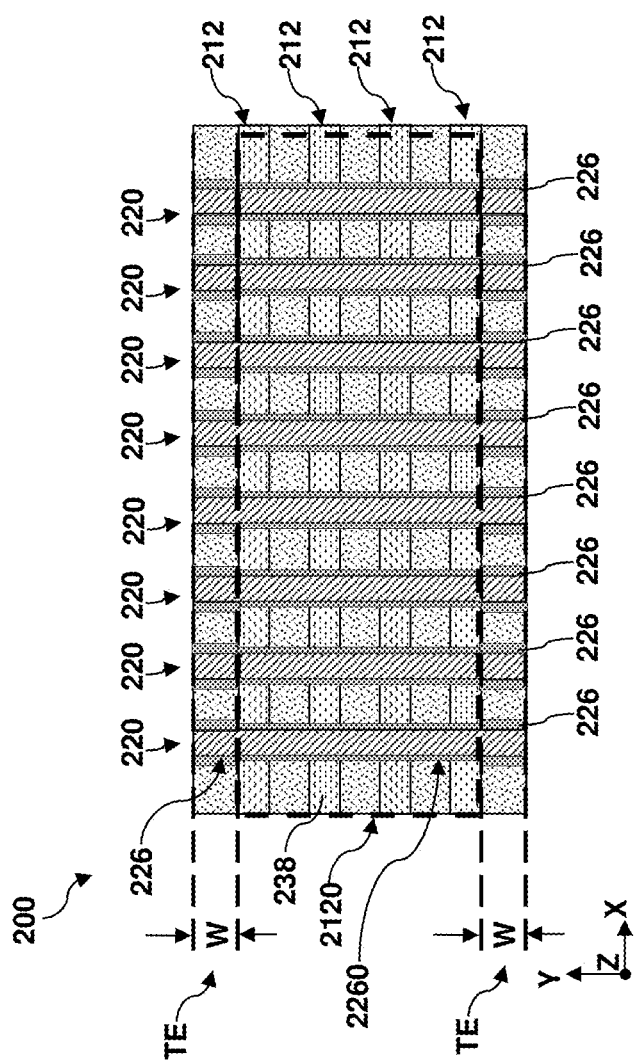

Referring to FIGS. 1, 17 and 18, method 100 includes a block 116 where source/drain features 238 are formed in the recessed source/drain regions. At block 116, the source/drain features 238 may be epitaxially and selectively formed from the exposed sidewalls of the channel layers 208 and exposed surfaces of the substrate 202 while sidewalls of the sacrificial layers 206 remain covered by the inner spacer features 234. Suitable epitaxial processes for block 116 include vapor-phase epitaxy (VPE), ultra-high vacuum CVD (UHV-CVD), molecular beam epitaxy (MBE), and/or other suitable processes. The epitaxial growth process at block 116 may use gaseous precursors, which interact with the composition of the substrate 202 as well as the channel layers 208. In some embodiments, parameters of the epitaxial growth process at block 116 are selected such that the source/drain features 238 is not epitaxially deposited on the inner spacer features 234. The source/drain features 238 may be n-type or p-type. When the source/drain features 238 is n-type, they include silicon (Si) and is doped with an n-type dopant, such as phosphorus (P) or arsenic (As). When the source/drain features 238 is p-type, they include silicon germanium (SiGe) and is doped with a p-type dopant, such as boron (B) or boron difluoride ($BF_2$). The source/drain features 238 may include multiple epitaxial layers with different germanium content and dopant concentration. In general, the epitaxial layers closer to the sidewalls of the channel layers 208 are lightly doped or have a smaller germanium content to reduce interfacial defects due to lattice mismatch. The epitaxial layers farther away from the channel layers 208 or closer to the contact interface with source/drain contacts are heavily doped to reduce contact resistance.

As described above with respect to block 114, operations at block 114 may affect operations at block 116. In one embodiment where the first patterned photoresist layer 236 is formed at block 114 to expose the entire device region 2120, operations at block 114 are performed once to form source/drain features 238 that are either n-type or p-type, depending on the design. In this embodiment, operations at blocks 114 and 116 will form source/drain features 238 of the same conductivity type in the device region 2120. In another embodiment where the second patterned photoresist layer 2362 is formed at block 114 to expose the n-type device region 2120N, n-type source/drain features 238 are formed at block 116. After the formation of the n-type source/drain features 238, the third patterned photoresist layer 2364 is formed at block 114 to expose the p-type device region 2120P, p-type source/drain feature 238 are formed at block 116. In this latter embodiment, operations at blocks 114 and 116 will form n-type source/drain features 238 in the n-type device region 2120N and form p-type source/drain features 238 in the p-type device region 2120P.

According to the present disclosure, in order to improve the crystallinity of the source/drain features 238, the epitaxial deposition of the source/drain features 238 may include both a growth component and an etch component. The precursors for growing the source/drain features 238 include growth gases and etching gasses. In embodiments where n-type source/drain features 238 are formed, the precursors may include silane, disilane, dichloro-silane, or a carbon containing silane (such as Monomethylsilane ($SiCH_3$) or $SiC_xH_4$-x) as growth gasses and hydrogen chloride, hydrogen fluoride, chlorine ($Cl_2$), and combinations thereof as etching gases. In embodiments where p-type source/drain features 238 are formed, the precursors may include silane, disilane, dichloro-silane, a carbon containing silane (such as Monomethylsilane ($SiCH_3$) or $SiC_xH_4$-x), germane ($GeH_4$), or a carbon containing germane (such as $GeCH_3$ or $GeC_xH_4$-x) as growth gasses to form silicon germanium and hydrogen chloride, hydrogen fluoride, chlorine ($Cl_2$), and combinations thereof as etching gases. Alternatively, the etching gases may include a fluorine-containing gas (e.g., $CF_4$, $SF_6$, $CH_2F_2$, $CHF_3$, and/or $C_2F_6$), or a combination thereof. The etching gases may remove undesirable epitaxial growth on dielectric surfaces, reduce loading effect, and improve quality of the source/drain features 238. During the epitaxial growth of the source/drain features 238, both growth component and etch component co-exist. However, as the growth rate is greater than the etch rate, the net effect is growth.

The growth component and the etch component operate differently with exposed dielectric features on the workpiece 200. The gate spacer layer 226 is one of them. As described above, the epitaxial growth is selectively to surfaces of semiconductor materials and is minimum on surfaces of dielectric materials. Because the gate spacer layer 226 is formed of dielectric materials, during the epitaxial growth of the source/drain features 238, the etch rate may be greater than the growth rate. Thus, with respect to the gate spacer layer 226, the net effect is etching. It has been observed that the gate spacer layer 226 exposed in the first patterned photoresist layer 236, the second patterned photoresist layer 2362, and the third patterned photoresist layer 2364 are etched during operations at block 116 while the gate spacer layer 226 over the terminal end portions (TEs, covered by all of these patterned photoresist layers) are not etched. As a result, the gate spacer layer 226 on sidewalls of the terminal end portions (TEs) remain substantially the same thickness while the gate spacer layer 226 in the device region 2120 are thinned to form thin gate spacer layer 2260. In some instances, a difference between a thickness of the gate spacer layer 226 along the X direction and a thickness of the thin gate spacer layer 2260 along the X direction is between about 1 nm and about 3 nm. Because the thin gate spacer layer 2260 is formed from the gate spacer layer 226, they are continuous with any visible interface in between.

While not explicitly shown, after the source/drain features 238 are formed on the workpiece 200, the first, second, or third patterned photoresist layer 236, 2362 or 2362, whichever is formed last, is removed by etching or ashing. Am anneal process may be performed to activate the dopants and improve the quality of the source/drain features 238. In some implementation, the anneal process may include a rapid thermal anneal (RTA) process, a laser spike anneal process, a flash anneal process, or a furnace anneal process. Through the anneal process, a desired electronic contribution of the p-type dopant or n-type dopant in the semiconductor host, such as silicon or silicon germanium (SiGe), may be obtained.

Figure 19:
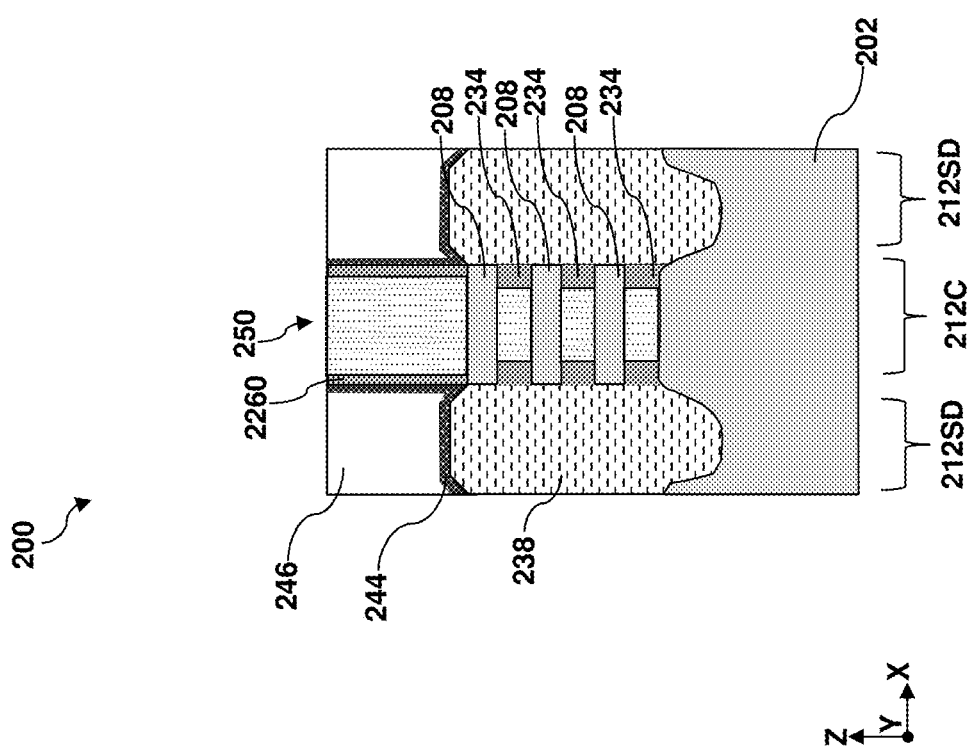
Figure 20:
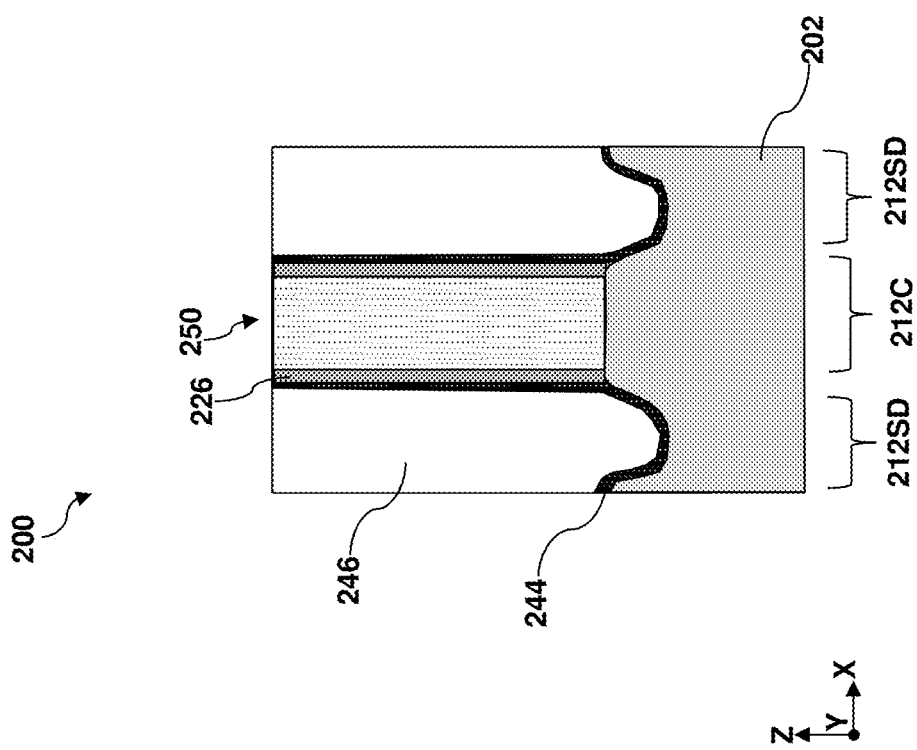

Referring to FIGS. 1, 19 and 20, method 100 includes a block 118 where a contact etch stop layer (CESL) 244 and an interlayer dielectric (ILD) layer 246 are deposited over the source/drain features 238. At block 118, the CESL 244 is deposited over the workpiece 200, including over the source/drain features 238, the gate spacer layer 226, the source/drain regions 212SD in the terminal end portions (TEs), the isolation feature 214, and the thin gate spacer layer 2260. Additionally, the ILD layer 246 is deposited over the CESL 244. In some examples, the CESL 244 includes silicon nitride, silicon oxynitride, and/or other materials known in the art. The CESL 244 may be formed by ALD, plasma-enhanced chemical vapor deposition (PECVD) process and/or other suitable deposition processes. The ILD layer 246 is then deposited over the CESL 244. In some embodiments, the ILD layer 246 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 246 may be deposited by a PECVD process or other suitable deposition technique.

Because the source/drain features 238 are only formed in the device regions 2120 due to use of the patterned photoresist layers at block 116, the CESL 244 is formed over different features in the device region 2120 and the terminal end portions (TEs). FIG. 19 illustrates an X-direction cross-sectional view of the device region 2120 of the workpiece 200. As shown in FIG. 19, in the device region 2120, the channel layers 208 are extending between two source/drain features 238 along the X direction. The source/drain features 238 are disposed directly on the recessed source/drain regions 212SD. The CESL 244 are disposed on top surfaces of the source/drain features 238 and along sidewalls of the thin gate spacer layer 2260. The ILD 246 is disposed over the CESL 244 and is spaced apart from the source/drain features 238 and the thin gate spacer layer 2260 by the CESL 244. The structures are different in the terminal end portions (TEs), which are substantially free of the source/drain features 238 due to the use of the patterned photoresist layers at block 116. FIG. 20 illustrates an X-direction cross-sectional view of a terminal end portion (TE) of the workpiece 200. As shown in FIG. 20, there are no channel layers 208 in the terminal end portion (TEs). Due to the absence of the source/drain features 238, the CESL 244 comes in direct contact with the inner spacers 234 and the substrate 202 in the source/drain regions 212SD. Additionally, the CESL 244 is also in direct contact with the gate spacer layer 226 that is not etched during the formation of the source/drain features 238. The different structures in the device region 2120 and the terminal end portions (TEs) are among the many characteristic features of the present disclosure.

Referring to FIGS. 1, 19 and 20, method 100 includes a block 120 where the dummy gate stacks 220 are replaced with gate structures 250. After the deposition of the CESL 244 and the ILD layer 246, the workpiece 200 may be planarized by a planarization process to expose the dummy gate stack 220. For example, the planarization process may include a chemical mechanical planarization (CMP) process. Exposure of the dummy gate stack 220 allows the removal thereof and release of the channel layers 208. In some embodiments, the removal of the dummy gate stack 220 results in a gate trench over the channel regions 212C. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 212C are exposed in the gate trench.

After the removal of the dummy gate stack 220, the sacrificial layers 206 between the channel layers 208 in the channel region 212C is selectively removed. The selective removal of the sacrificial layers 206 releases the channel layers 208 to form channel members 208 shown in FIGS. 19 and 20. For ease of reference, both the channel layers and the released channel members share the same reference numerals. The selective removal of the sacrificial layers 206 also exposes lateral surfaces of each channel members 208. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture). The channel members 208 may also be referred to nanostructures, nanowires (if their widths are not substantially greater than their heights), or nanosheet (if their widths are substantially greater than their heights).

After the release of the channel members 208, the gate structure 250 is formed to wrap around each of the channel members 208. The gate structure 250 includes a gate dielectric layer and a gate electrode layer over the gate dielectric layer. In some embodiments, while not explicitly shown in the figures, the gate dielectric layer includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a CMP process may be performed to remove excessive metal, thereby providing a substantially planar top surface of the gate structure 250. The release of the channel layers 208 and the formation of the gate structures 250 do not substantially alter the aforementioned structural differences in the device region 2120 and the terminal end portions (TEs). For example, in the terminal end portions (TEs), the gate structure 250 does not wrap around any channel layers 208 as none are present. The gate structures 250 are spaced apart from the CESL 244 by the gate spacer layer 226.

Although not intended to be limiting, one or more embodiments of the present disclosure provide many benefits to a semiconductor device and the formation thereof. For example, while methods of the present disclosure recess the source/drain regions without use of an etch mask, one or more patterned photoresist layers are formed to cover terminal end portions of the dummy gate structures when source/drain features are formed. The use of the patterned photoresist layer prevents undesirable epitaxial growth on terminal end surfaces, which may lead to shorts or reliability issues. Because of the use of patterned photoresist layer during the formation of the source/drain features, the gate spacer layer in the terminal end portions are thicker than the thin gate spacer layer in the device region.

In one exemplary aspect, the present disclosure is directed to a method. The method includes providing a workpiece that includes a plurality of active regions including channel regions and source/drain regions, and a plurality of dummy gate stacks intersecting the plurality of active regions at the channel regions, the plurality of dummy gate stacks including a device portion and a terminal end portion. The method further includes depositing a gate spacer layer over the workpiece, anisotropically etching the workpiece to recess the source/drain regions and to form a gate spacer from the gate spacer layer, the gate spacer being disposed along sidewalls of the plurality of dummy gate stacks, after the anisotropically etching, forming a patterned photoresist layer over the workpiece to expose the device portion of the plurality of dummy gate stacks and the recessed source/drain regions while the terminal end portion of the plurality of dummy gate stacks is covered, and after the forming of the patterned photoresist layer, epitaxially forming source/drain features over the recessed source/drain regions.

In some embodiments, the epitaxially forming includes an etching component that etches the gate spacer layer exposed in the patterned photoresist layer. In some implementations, the epitaxially forming reduces a thickness of the gate spacer on sidewalls of the device portion of the plurality of dummy gate stacks while the gate spacer on sidewalls of the terminal end portion of the plurality dummy gate stacks. In some instances, the epitaxial forming does not form any source/drain features in contact with the terminal end portion of the plurality of dummy gate stacks. In some embodiments, the method may further include after the epitaxially forming, depositing a contact etch stop layer (CESL) over the source/drain features, and depositing an interlayer dielectric (ILD) layer over the CESL. In some embodiments, the depositing of the CESL includes depositing the CESL over sidewalls of the terminal end portion of the plurality of dummy gate stacks. In some embodiments, the providing of the workpiece includes alternatingly depositing a plurality of first semiconductor layer and a plurality of second semiconductor layer over a semiconductor substrate to form a stack, patterning the stack to form the plurality of active regions, depositing a dummy dielectric layer and a dummy electrode layer over the plurality of the active regions and the semiconductor substrate, and patterning the dummy dielectric layer and the dummy electrode layer to form the plurality of dummy gate stacks. In some instances, the method may further include before the epitaxially forming, partially and selectively recessing the plurality of second semiconductor layers to form inner spacer recesses, depositing an inner spacer feature over the inner spacer recesses, and etching back the inner spacer feature to form inner spacer features in the inner spacer recesses.

In another exemplary aspect, the present disclosure is directed to a method. The method includes forming a plurality of fin-shaped active regions over a substrate, wherein each of the plurality of fin-shaped active regions includes a plurality of silicon layers interleaved by a plurality of silicon germanium layers, forming a dummy gate stack over the plurality of fin-shaped active regions, wherein the dummy gate stack overshoots the plurality of fin-shaped active regions by a first terminal end portion and a second terminal end portion, depositing a gate spacer layer over the dummy gate stack, after the depositing of the gate spacer layer, anisotropically etching the plurality of fin-shaped active regions to form recessed source/drain regions, and forming source/drain features in the recessed source/drain regions while the first terminal end portion and the second terminal end portion are covered by a patterned photoresist layer.

In some embodiments, the dummy gate stack includes polysilicon. In some implementations, the gate spacer layer includes silicon oxide, silicon nitride, silicon oxynitride, silicon oxycarbonitride, or silicon carbonitride. In some implementations, the anisotropically etching forms a gate spacer along sidewalls of the dummy gate stack. In some embodiments, the forming of the source/drain features includes etching the gate spacer along sidewalls of a device portion of the dummy gate stack while the gate spacer along sidewalls of the first terminal end portion and the second terminal end portion is covered by the patterned photoresist layer. In some implementations, the method may further include after the forming of the source/drain features, depositing a contact etch stop layer (CESL) over the source/drain features. The CESL is in contact with plurality of silicon layers in the first terminal end portion and the second terminal end portion.

In yet another exemplary aspect, the present disclosure is directed to a semiconductor structure. The semiconductor structure includes a first source/drain feature and a second source/drain feature, a plurality of nanostructures disposed one over another and extending between the first source/drain feature and the second source/drain feature, a gate structure including a gate portion wrapping around each of the plurality of nanostructures and an overshoot portion abutting the gate portion, a first gate spacer disposed over sidewalls of the gate portion of the gate structure, and a second gate spacer disposed over sidewalls of the overshoot portion of the gate structure. A first thickness of the first gate spacer is smaller than a second thickness of the second gate spacer.

In some embodiments, a difference between the second thickness and the first thickness is between about 1 nm and about 3 nm. In some embodiments, the semiconductor structure may further include a contact etch stop layer (CESL) in contact with the first gate spacer and the second gate spacer. In some implementations, the first gate spacer is continuous with the second gate spacer. In some instances, the first source/drain feature and the second source/drain feature include silicon doped with an n-type dopant. In some embodiments, the second source/drain feature and the second source/drain feature include silicon germanium doped with a p-type dopant.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a workpiece comprising:
        a plurality of active regions extending parallel to one another along a first direction, spaced apart from one another along a second direction perpendicular to the first direction, comprising channel regions and source/drain regions, and
        a plurality of dummy gate stacks, each of the plurality of dummy gate stacks including a device portion extending continuously over the plurality of active regions along the second direction and a terminal end portion outside the device portion, the terminal end portion being not disposed between any two the plurality of active regions along the second direction;
    depositing a gate spacer layer over the workpiece;
    anisotropically etching the workpiece to recess the source/drain regions and to form a gate spacer from the gate spacer layer, the gate spacer being disposed along sidewalls of the plurality of dummy gate stacks;
    after the anisotropically etching, forming a patterned photoresist layer over the workpiece to expose the device portion of the plurality of dummy gate stacks and the recessed source/drain regions while the terminal end portion of the plurality of dummy gate stacks is covered; and
    after the forming of the patterned photoresist layer, epitaxially forming source/drain features over the recessed source/drain regions.

2. The method of claim 1, wherein the epitaxially forming comprises an etching component that etches the gate spacer layer exposed in the patterned photoresist layer.

3. The method of claim 2, wherein the epitaxially forming reduces a thickness of the gate spacer on sidewalls of the device portion of the plurality of dummy gate stacks while the gate spacer on sidewalls of the terminal end portion of the plurality dummy gate stacks.

4. The method of claim 1, wherein the epitaxially forming does not form any source/drain features in contact with the terminal end portion of the plurality of dummy gate stacks.

5. The method of claim 1, further comprising:
    after the epitaxially forming, depositing a contact etch stop layer (CESL) over the source/drain features; and
    depositing an interlayer dielectric (ILD) layer over the CESL.

6. The method of claim 5, wherein the depositing of the CESL comprises depositing the CESL over sidewalls of the terminal end portion of the plurality of dummy gate stacks.

7. The method of claim 1, wherein the providing of the workpiece comprises:
    alternatingly depositing a plurality of first semiconductor layer and a plurality of second semiconductor layers over a semiconductor substrate to form a stack;
    patterning the stack to form the plurality of active regions;
    depositing a dummy dielectric layer and a dummy electrode layer over the plurality of the active regions and the semiconductor substrate; and
    patterning the dummy dielectric layer and the dummy electrode layer to form the plurality of dummy gate stacks.

8. The method of claim 7, further comprising:
    before the epitaxially forming, partially and selectively recessing the plurality of second semiconductor layers to form inner spacer recesses;
    depositing an inner spacer feature over the inner spacer recesses; and
    etching back the inner spacer feature to form inner spacer features in the inner spacer recesses.

9. A method, comprising:
    forming a plurality of fin-shaped active regions over a substrate, wherein each of the plurality of fin-shaped active regions comprises a plurality of silicon layers interleaved by a plurality of silicon germanium layers, the plurality of fin-shaped active regions defining a rectangular area having a first fin-shaped active region of the plurality of fin-shaped active regions at a first boundary of the rectangular area and a second fin-shaped active region of the plurality of fin-shaped active regions at a second boundary of the rectangular area;
    forming a dummy gate stack comprising a device portion spanning continuously over the rectangular area, a first terminal end portion overshooting the first fin-shaped active region and a second terminal end portion overshooting the second fin-shaped active region;
    depositing a gate spacer layer over the dummy gate stack;
    after the depositing of the gate spacer layer, anisotropically etching the plurality of fin-shaped active regions to form recessed source/drain regions; and
    forming source/drain features in the recessed source/drain regions while the first terminal end portion and the second terminal end portion are covered by a patterned photoresist layer.

10. The method of claim 9, wherein the dummy gate stack comprises polysilicon.

11. The method of claim 9, wherein the gate spacer layer comprises silicon oxide, silicon nitride, silicon oxynitride, silicon oxycarbonitride, or silicon carbonitride.

12. The method of claim 9, wherein the anisotropically etching forms a gate spacer along sidewalls of the dummy gate stack.

13. The method of claim 12, wherein the forming of the source/drain features comprises etching the gate spacer along sidewalls of a device portion of the dummy gate stack while the gate spacer along sidewalls of the first terminal end portion and the second terminal end portion is covered by the patterned photoresist layer.

14. The method of claim 9, further comprising:
after the forming of the source/drain features, depositing a contact etch stop layer (CESL) over the source/drain features,
wherein the CESL is in contact with the plurality of silicon layers in the first terminal end portion and the second terminal end portion.

15. A method, comprising:
providing a workpiece comprising:
a plurality of active regions extending lengthwise along a first direction and spaced apart from each other along a second direction perpendicular to the first direction, the plurality of active regions defining a rectangular area having a first active region of the plurality of active regions at a first boundary of the rectangular area and a second active region of the plurality of active regions at a second boundary of the rectangular area;
a plurality of dummy gate stacks extending lengthwise along the second direction, each of the plurality of dummy gate stacks including a device portion that spans continuously over the rectangular area and a terminal end portion to overshoot the rectangular area along the second direction;
depositing a gate spacer layer over the workpiece;
anisotropically etching the workpiece to form source/drain recesses in the plurality of active regions not covered by the plurality of dummy gate stacks;
after the anisotropically etching, forming a patterned photoresist layer to cover the terminal end portion while the device portion is exposed; and
after the forming of the patterned photoresist layer, epitaxially forming source/drain features over the source/drain recesses.

16. The method of claim 15, wherein the plurality of dummy gate stacks comprise polysilicon.

17. The method of claim 15, wherein the epitaxially forming comprises an etching component that etches the gate spacer layer exposed in the patterned photoresist layer.

18. The method of claim 15, wherein the epitaxially forming does not form any source/drain features in contact with the terminal end portion of the plurality of dummy gate stacks.

19. The method of claim 15, further comprising:
after the epitaxially forming, depositing a contact etch stop layer (CESL) over the source/drain features; and
depositing an interlayer dielectric (ILD) layer over the CESL.

20. The method of claim 19, wherein the depositing of the CESL comprises depositing the CESL over sidewalls of the terminal end portion of the plurality of dummy gate stacks.

* * * * *